(12) United States Patent
Usami

(10) Patent No.: US 7,057,286 B2
(45) Date of Patent: Jun. 6, 2006

(54) SEMICONDUCTOR DEVICE AND METHOD OF MANUFACTURING THE SAME

(75) Inventor: Tatsuya Usami, Tokyo (JP)

(73) Assignee: NEC Electronics Corporation (JP)

( * ) Notice: Subject to any disclaimer, the term of this patent is extended or adjusted under 35 U.S.C. 154(b) by 33 days.

(21) Appl. No.: 10/260,947

(22) Filed: Sep. 30, 2002

(65) Prior Publication Data

US 2003/0089990 A1 May 15, 2003

Related U.S. Application Data

(62) Division of application No. 09/910,994, filed on Jul. 23, 2001, now Pat. No. 6,514,852.

(30) Foreign Application Priority Data

Jul. 24, 2000 (JP) .............................. 2000-222414

(51) Int. Cl.
*H01L 23/28* (2006.01)
(52) U.S. Cl. ....................... 257/758; 257/761; 257/750; 257/751; 257/760; 257/762; 257/759; 257/639; 257/640; 438/639; 438/640
(58) Field of Classification Search ................ 257/761, 257/758, 750, 751, 760, 762, 759, 639, 640; 438/637, 780
See application file for complete search history.

(56) References Cited

U.S. PATENT DOCUMENTS 6,140,226 A * 10/2000 Grill et al. .................. 438/637
6,225,207 B1 * 5/2001 Parikh ........................ 438/622
6,514,852 B1 * 2/2003 Usami ........................ 438/624

* cited by examiner

*Primary Examiner*—Donghee Kang
*Assistant Examiner*—Junghwha Im
(74) *Attorney, Agent, or Firm*—Hayes Soloway P.C.

(57) ABSTRACT

A method for manufacturing a multi-level interconnection structure in a semiconductor device includes the steps of consecutively forming an anti-diffusion film and an interlevel dielectric film on a first level Cu layer, forming first through third hard mask films on the interlevel dielectric film, etching the interlevel dielectric film by using the first hard mask to form first through-holes, etching the first and second hard mask films and a top portion of the interlevel dielectric film by using the third hard mask film to form trenches, and etching the anti-diffusion film to form through-holes. The first hard mask film protects the interlevel dielectric film during removal of the second and third hard mask films.

10 Claims, 22 Drawing Sheets

SEMICONDUCTOR DEVICE AND METHOD OF MANUFACTURING THE SAME

The present Application is a divisional Application of prior U.S. application Ser. No. 09/910,994 filed Jul. 23, 2001 now U.S. Pat. No. 6,514,852.

BACKGROUND OF THE INVENTION (a) Field of the Invention

The present invention relates to a method for manufacturing semiconductor devices, and more particularly to a semiconductor device manufacturing method which addresses the need for further miniaturization of interconnection patterns.

(b) Description of the Prior Art

In response to an increasing need for further miniaturization and integration of semiconductor devices, formation of an embedded interconnection structure by using a dual damascene technique is now attracting attention. Also, in order to reduce signal transmission delays caused by the finer interconnections, it is proposed to adopt an interconnection structure including a low-permittivity layer ("low-K layer") as the interlevel dielectric film, together with the formation of the embedded interconnection structure.

Conventionally, two methods are proposed and implemented for using the low-K layer as the interlevel dielectric film and forming the embedded interconnection structure based on the dual damascene technique.

First Conventional Method

Referring to FIGS. 1A to 1H, a conventional method (hereinafter referred to as "the first conventional method") for the formation of the low-K layer as the interlevel dielectric film and the embedded interconnection structure based on the dual damascene technique will be described. These figures are sectional views consecutively illustrating the respective steps of the process for formation of the embedded interconnection structure by using the first conventional method.

In the first conventional method, through-holes are first formed, and then an interconnection trench structure for receiving therein upper-level interconnections is formed, as will be described hereinafter.

First, as shown in FIG. 1A, a P-type SiN film (referred to as P—SiN film hereinafter) 14 having a film thickness of 50 nm is formed by a plasma CVD method as an anti-diffusion layer for suppressing diffusion of Cu atoms in a Cu layer 12 formed as lower-level interconnections. A low-K layer 16 having a film thickness of 700 nm is then formed as an interlevel dielectric film. A P—SiO$_2$ film 18 having a film thickness of 100 nm is further formed thereon by a plasma CVD method.

Thereafter, as shown in FIG. 1B, a first anti-reflection coat (first ARC film) 20 having a film thickness of 100 nm is formed on the P—SiO$_2$ film 18. A photoresist film having a film thickness of 600 nm is formed on the first ARC film 20 by coating, followed by selectively etching thereof to form an etching mask 22 having a through-hole pattern.

Then, the first ARC film 20 and the P—SiO$_2$ film 18 are selectively etched by a dry-etching technique using the etching mask 22 and a fluorocarbon gas. Next, a mixture of nitrogen and hydrogen gases is used to remove the etching mask 22 of the photoresist, the first ARC film 20 below the etching mask 22, and part of the low-K film 16 where the P—SiO$_2$ film 18 is etched. By this etching, the etching mask 22 of the photoresist film and the first ARC film 20 are completely removed to form through-holes 24 exposing P—SiN film 14 therethrough.

Thereafter, as shown in FIG. 1D, a second ARC film 26 is formed on the entire surface of the P—SiO$_2$ film 18 while simultaneously filling the through-holes 24. Then, a photoresist film 28 is formed on the second ARC film 26 by coating.

As shown in FIG. 1E, the photoresist film 28 is then patterned, whereby an etching mask 30 having an interconnection pattern of the upper-level interconnections is formed.

Then, the second ARC film 26 and the P—SiO$_2$ film 18 are subjected to selective etching using the etching mask 30 and a fluorocarbon gas as the etching gas, followed by selective etching of the low-K film 16. This etching allows the photoresist mask 30 and the first ARC film 20 underlying the same to be completely removed, as shown in FIGS. 1F and 1G.

Thereafter, the P—SiN layer 14 on the Cu layer 12 is etched, thereby forming through-holes 32 for exposing therethrough the Cu layer 12, as shown in FIG. 1H.

Then, a barrier metal layer not shown is formed on the inner wall of the through-holes 32 and the interconnection trenches 34 as well as on top of the P—SiO$_2$ film 18, and further a Cu layer is deposited thereon, thereby completely filling the through-holes 32 and the interconnection trenches 34 with the Cu layer.

After removing the Cu layer and the barrier metal layer on top of the P—SiO$_2$ film 18 by a CMP method, embedded upper-level interconnections connected to the lower-level Cu layer 12 via the through-holes 32 can be formed.

Second Conventional Method

Referring to FIGS. 2A to 2I, another conventional method (hereinafter referred to as "second conventional method") for formation of the embedded interconnection structure based on the dual damascene method, which uses the low-K layer as the interlevel dielectric film, will be described. These figures are sectional views of the respective steps of the process for forming the interconnections by using the second conventional method.

In the second conventional method, the interconnection trenches are first formed and then the through-holes are formed, as will be described hereinafter.

As shown in FIG. 2A, there are consecutively formed, on a Cu layer 36 formed as the lower-level interconnections, a P—SiN film 38 having a film thickness of 50 nm as the anti-diffusion film for the Cu atoms, a low-K layer 40 having a film thickness of 700 nm as an interlevel dielectric film and a P—SiO$_2$ film 42 and P—SiN film 44, each having a film thickness of 50 nm, as a hard mask film.

Then, as shown in FIG. 2B, a 400-nm-thick photoresist film is formed on the P—SiN film 44 by coating, followed by selective etching thereof to form an etching mask 46 having an interconnection pattern of the upper-level interconnections. Prior to the formation of the photoresist film, an ARC film may be formed.

The etching mask 46 is used to etch the P—SiN film 44 as shown in FIG. 2C, thereby exposing part of the P—SiO$_2$ film 42. Trenches 47 are then formed which have the same width as the interconnections of the upper-level interconnection structure.

Then, as shown in FIG. 2D, the P—SiN film 44 is exposed by removing the etching mask 46 by an O$_2$ plasma ashing method.

As shown in 2E, a photoresist film is then formed by coating and patterned by etching, thereby forming an etching mask 48 having a through-hole pattern.

Referring to FIG. 2F, the P—SiO$_2$ film 42 is then etched to form through-holes 50 which expose part of the low-K layer 40.

Next, the etching mask 48 is used to etch the low-K layer 40, thereby forming through-holes 52A for exposing the P—SiN film 38. Subsequently, the etching mask of the photoresist film is removed at the same time with the low-K film, as shown in FIG. 2G.

The P—SiN film 44 is then used as the etching mask to etch the P—SiO$_2$ film 42 and the low-K layer 40, whereby interconnection trenches 54 for the upper-level interconnections are formed, as shown in FIG. 2H.

Further, the low-K layer 40 is used as the etching mask to etch the P—SiN film 38, whereby through-holes 52 are formed which communicate to the interconnection trenches 54 and exposing part of the Cu layer 36, as shown in FIG. 2I.

Then, a barrier metal layer not shown is formed on the inner walls of the through-holes 52 and the interconnection trenches 54 as well as on top of the P—SiO$_2$ film 44. A further Cu layer is deposited, thereby forming a Cu layer having a sufficient thickness for filling the through-holes 52 and the interconnection trenches 54.

After the Cu layer and the barrier metal layer on top of the P—SiO$_2$ film 44 are removed by a CMP method, embedded interconnections connected to lower-level Cu layer 36 through via plugs can be formed.

The first and second conventional methods as described above have the following problems, however.

In the case of the first conventional method, if the trench pattern formed for the upper-level interconnections is misaligned with respect to the through-hole pattern, the wafer has to be discarded, making it difficult to improve the product yield.

More specifically, as shown in FIG. 3A, after the etching mask 30 is formed, the trench pattern of the etching mask 30 having the same pattern as the interconnection pattern for the upper-level interconnections may be misaligned with respect to the through-hole 32A (the upper part of the through-hole 32). However, since the low-K layer is used as the interlevel dielectric film 16, once such a misalignment occurs between the interconnection (trench) pattern of the etching mask 30 and the through-hole pattern, it is extremely difficult to correct or reconstruct the misalignment of the etching mask 30, and the wafer having the chip area with the misalignment had to be discarded.

This is because if the misaligned etching mask 30 is removed by using some technique such as O$_2$ plasma ashing, the low-K layer 16 is also etched, resulting in a cavity in the resultant interlevel dielectric film, such as shown in FIG. 3B.

In the case of the second conventional method, on the other hand, if the position of the through-hole pattern of the etching mask 48 is misaligned with respect to the trench 47 (with the same pattern and diameter as the interconnection trench 54) as shown in FIG. 4A, the diameter of hole 50 (with the same pattern and diameter as the through-hole 52) formed by etching the P—SiO$_2$ film 42 decreases.

The reduced diameter of the through-hole 52 causes the through-hole 52 to be positioned towards one side of the interconnection trench 54.

This adversely affects the coverage of a Ta layer 56 formed on the inner walls of the through-hole 52 as the barrier metal layer. Consequently, as shown in FIG. 4C, the film thickness of part of Ta layer 56 will be significantly reduced, so that a void will appear upon embedding the through-hole 52 and the interconnection trench 52 with a Cu layer 58, resulting in an increased contact resistance or even deficient conduction.

Such problems caused by the interconnection trench pattern of the etching mask for the upper-level interconnections being misaligned with respect to the through-hole, as well as the through-hole pattern of the etching mask being misaligned with respect to the upper-level interconnection trench, are often associated with the finer interconnection pattern accompanied by a reduced alignment margin.

Therefore, it is undesirable to discard the wafer every time such a misalignment occurs or to produce products that are eventually picked out for conduction errors from the point of view of product yield.

SUMMARY OF THE INVENTION

It is therefore an object of the invention to provide a method of forming an embedded interconnection structure by using the dual damascene method at a higher product yield.

The present invention provides a method for forming a multi-level interconnection structure in a semiconductor device, the method including the steps of: forming first level interconnections overlying a substrate; consecutively forming first and second dielectric films on the first level interconnections; consecutively forming first through third hard mask films on the second dielectric film, the first through third hard mask films being insulating films and having different etching rates in an etching condition; selectively etching the second and third hard mask films to form a through-hole pattern on the second and third hard mask films; selectively etching the third hard mask film to form a trench pattern on the third hard mask film, the trench pattern partially overlapping the through-hole pattern; selectively etching the first hard mask film by using the second hard mask film as an etching mask to form the through-hole pattern on the first hard mask film; selectively etching the second dielectric film by using the first hard mask film as an etching mask to form first through-holes in the second dielectric film based on the through-hole pattern; selectively etching the first and second hard mask films and a top portion of the first dielectric film by using the third hard mask film as an etching mask to form trenches in the first and second hard mask films and the top portion of the second dielectric film based on the trench pattern; and selectively etching the first dielectric film to form therein second through-holes communicated with the respective first through-holes for exposing part of the first level interconnections through the first and second through-holes.

In accordance with the method of the present invention, the first through third hard mask films can be used separately for etching different films. In this configuration, after the selective etching of the first and second hard mask films and a top portion of the first dielectric film and when the second and third hard mask films are removed by ashing, for example, the first hard mask film protects the remaining portion of the second dielectric film even if there is a misalignment to some extent between the trench pattern and the through-hole pattern.

DETAILED DESCRIPTION OF THE PREFERRED EMBODIMENTS

Now, the present invention will be described by way of embodiments with reference to the attached drawings.

First Embodiment

A first embodiment, which is an example of the method of manufacturing semiconductor devices according to the present invention, will be described with reference to FIGS. 5A to 5L. These drawings show sectional views of a semiconductor device, illustrating consecutive steps of the process for forming the interconnection structure according to the first embodiment.

Figure 1A:
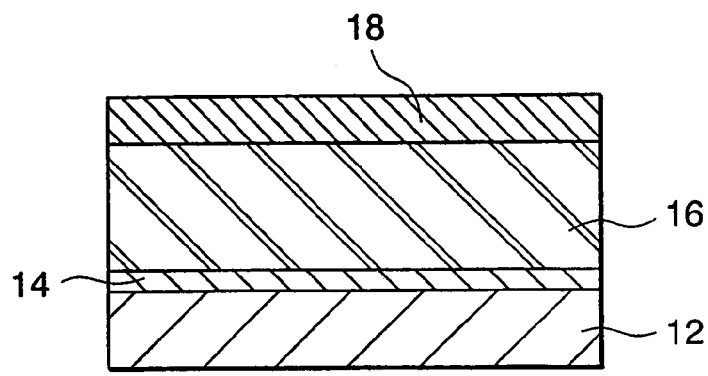
FIGS. 1A to 1H are sectional views of a semiconductor device, illustrating consecutive steps of the process for forming the interconnection structure by using a first conventional method.
Figure 1B:
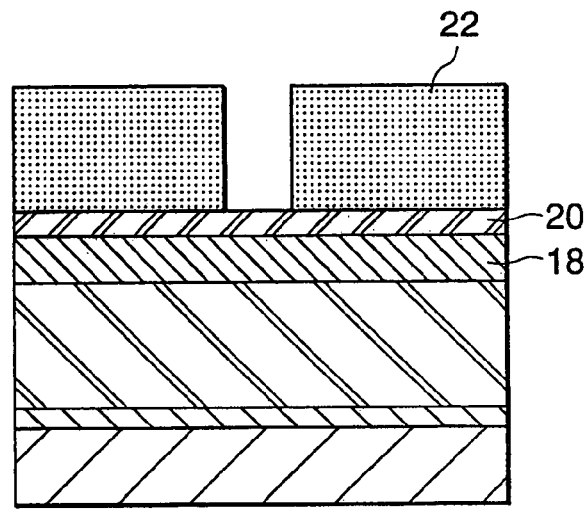
Figure 1C:
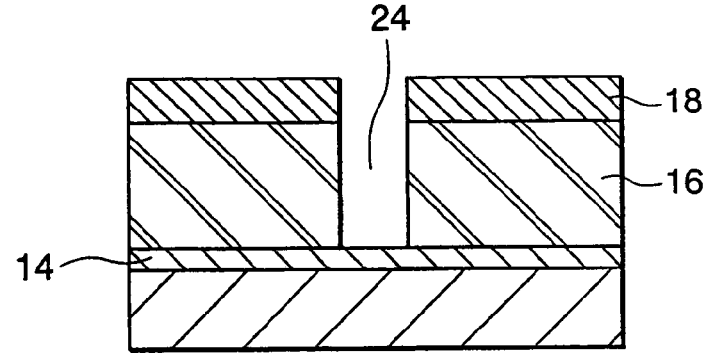
Figure 1D:
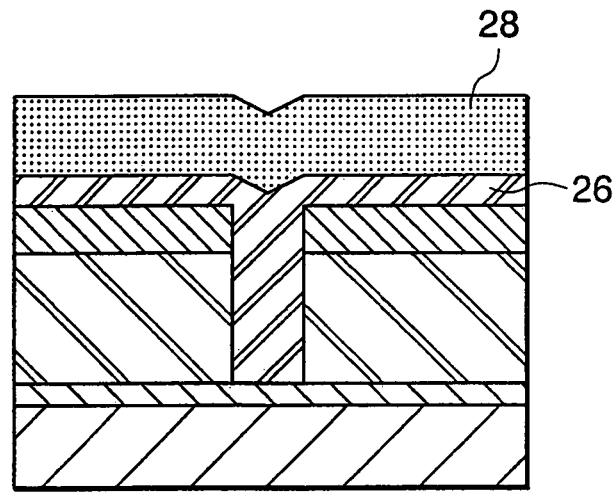
Figure 1E:
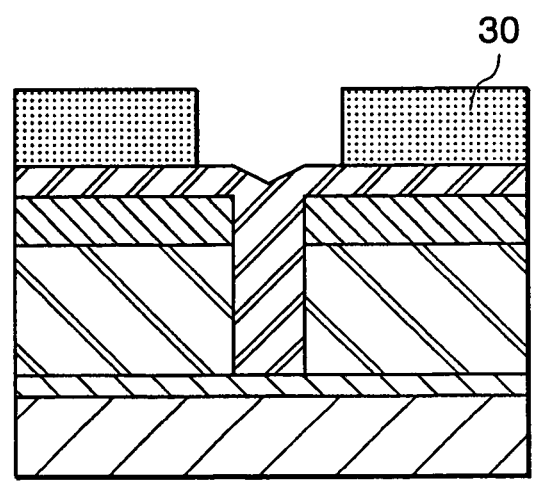
Figure 1F:
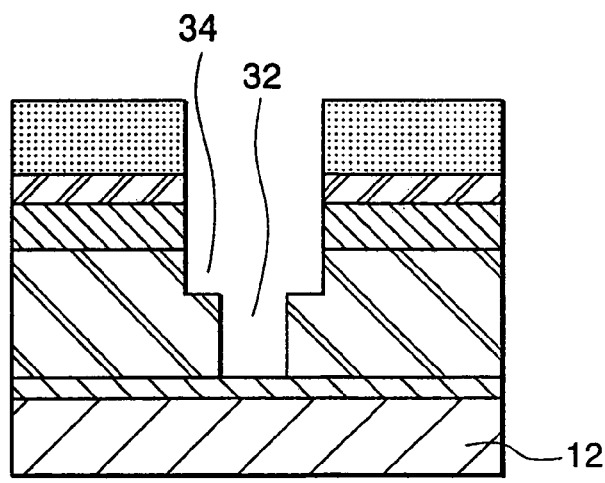
Figure 1G:
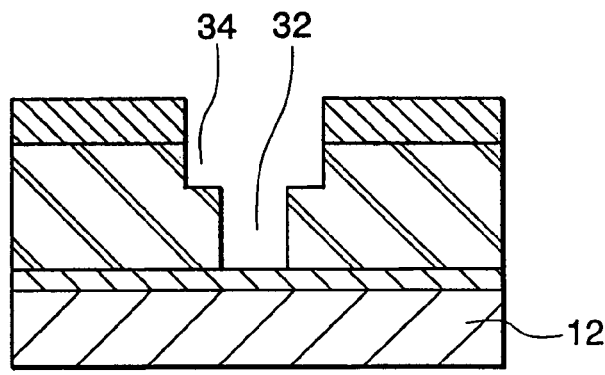
Figure 1H:
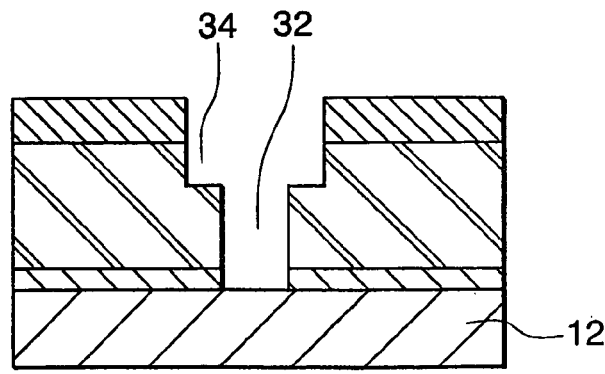
Figure 2A:
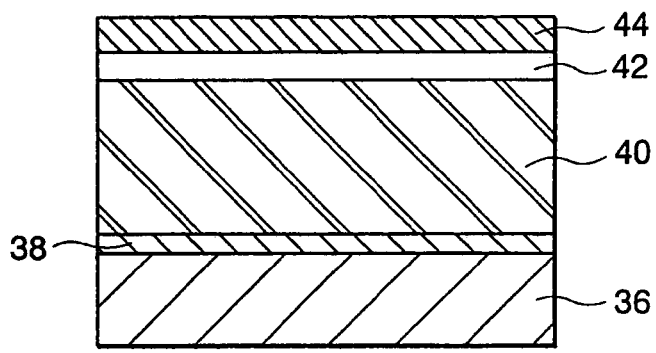
FIGS. 2A to 2I are sectional views of a semiconductor device, illustrating consecutive steps of the process for forming the interconnection structure by using a second conventional method.
Figure 2B:
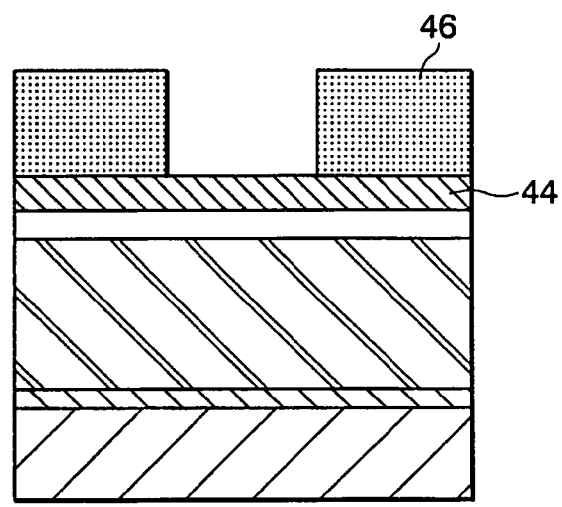
Figure 2C:
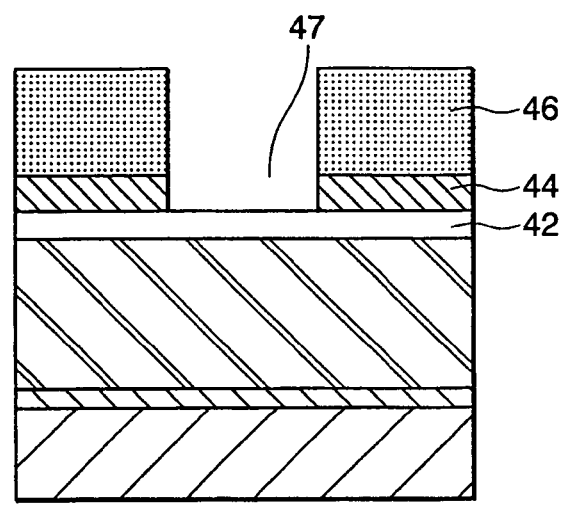
Figure 2D:
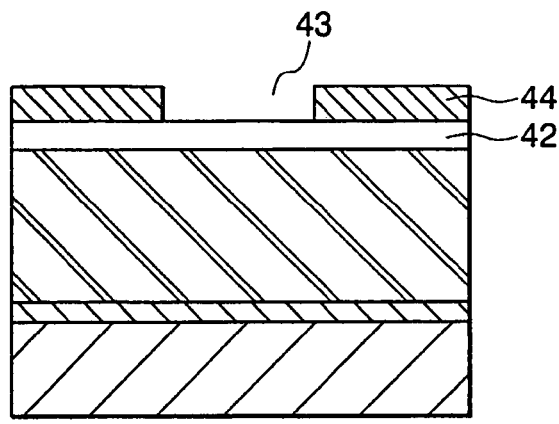
Figure 2E:
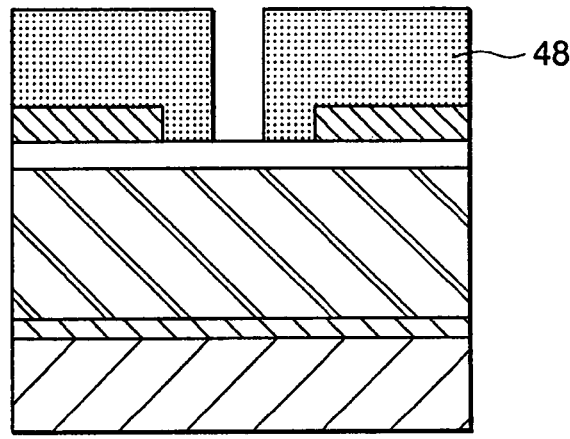
Figure 2F:
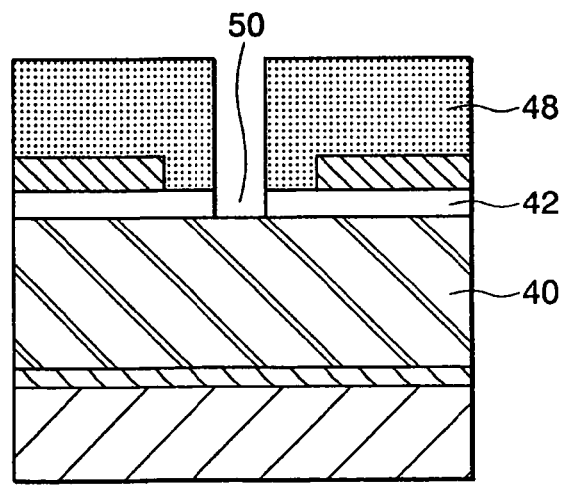
Figure 2G:
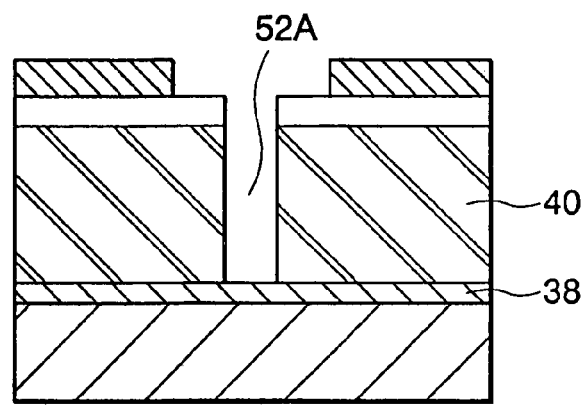
Figure 2H:
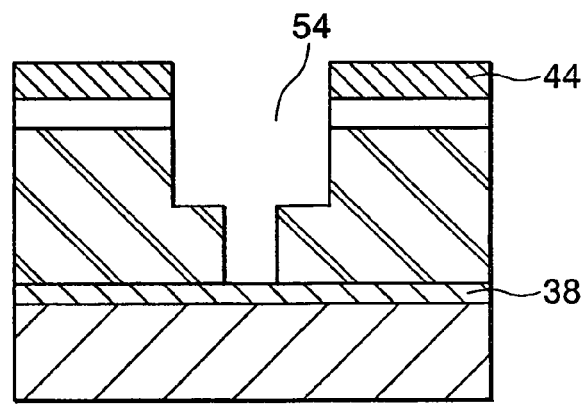
Figure 2I:
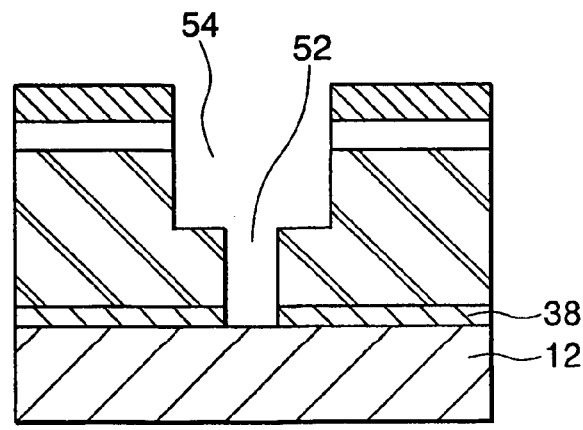
Figure 3A:
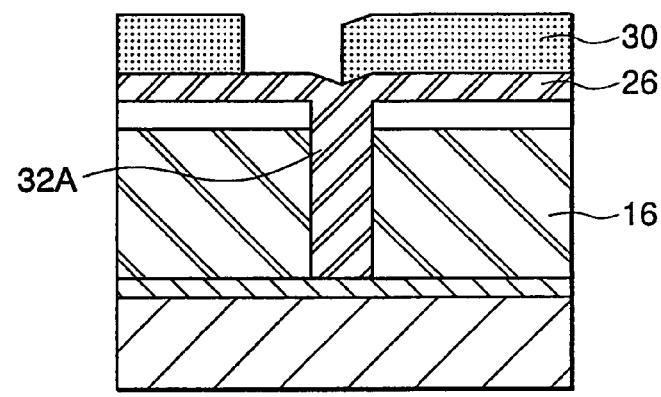
FIGS. 3A and 3B are schematic sectional views for illustrating problems encountered when forming the embedded interconnection structure by using the first conventional method.
Figure 3B:
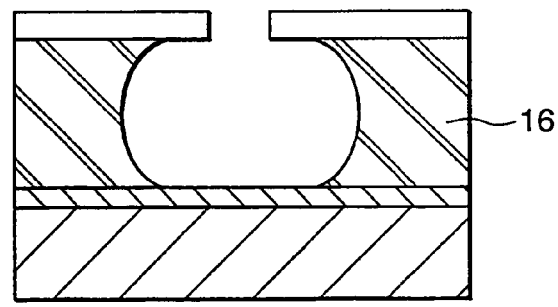
Figure 4A:
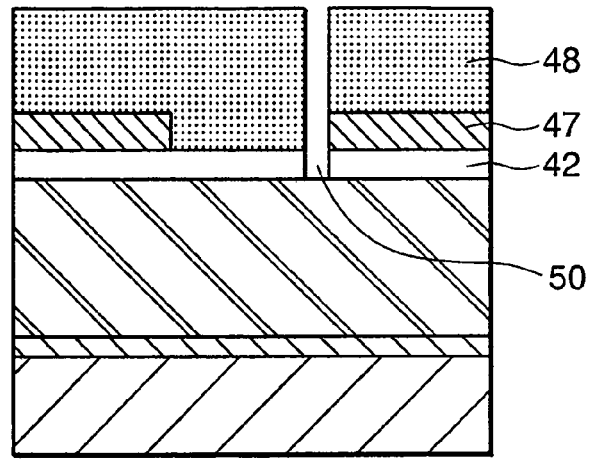
FIGS. 4A to 4C are schematic sectional views for illustrating problems encountered when forming the embedded interconnection structure by using the second conventional method.
Figure 4B:
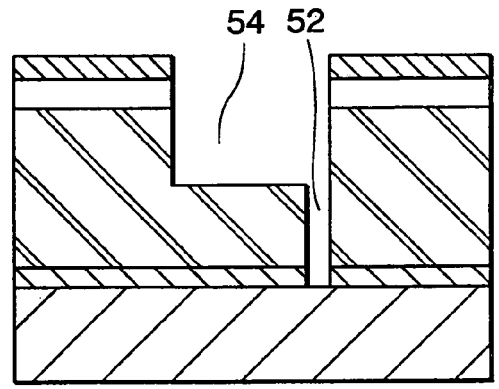
Figure 4C:
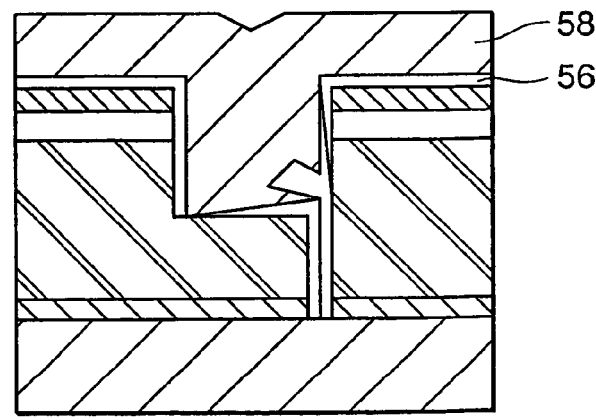
Figure 5A:
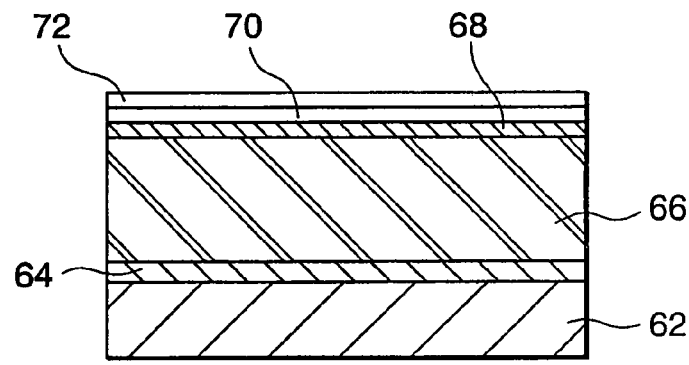
FIGS. 5A to 5L are sectional views of a semiconductor device, illustrating consecutive steps for the process of forming the interconnection structure according to a first embodiment of the present invention.

In FIG. 5A, a P—SiC film 64 having a 50 nm film thickness is first formed by a plasma CVD method on a Cu layer 62 formed as lower-level interconnections. Then, a low-permittivity layer 66 (referred to as "low-K layer" hereinafter) having an 800 nm film thickness is formed on the P—SiC film 64 as an interlevel dielectric film by a plasma CVD method. Further, a P—SiC film 68, a. P—SiO$_2$ film 70, and a P—SiN film 72, each having a 50 nm film thickness, are consecutively formed, also by using a plasma CVD method, whereby a triple hard mask structure is formed.

The P—SiC film 64 functions as an anti-diffusion film for suppressing diffusion of the Cu atoms in the Cu layer 62. In second and third embodiments to be described later, the function of the P—SiC film on the Cu layer of the lower-level interconnection is similar. As the low-K layer, an organic polymer such as SiLK (trade mark) from Dow Chemical Co. or PLARB (trade mark) from Honeywell Colo. can be used.

Figure 5B:
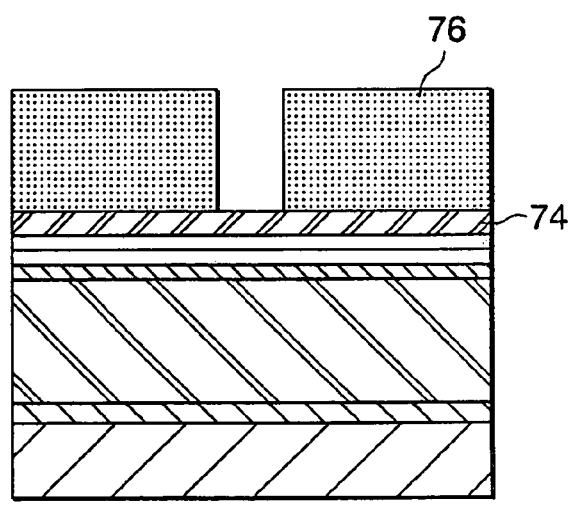

Next, as shown in FIG. 5B, a first anti-reflection film (referred to as "first ARC film" hereinafter) 74 having a film thickness of 100 nm is formed on the P—SiN film 72, followed by formation of a photoresist film having a film thickness of 400 nm. Then, an etching mask 76 having a through-hole pattern is formed. The first ARC film is of the novorak resin type, for example.

Figure 5C:
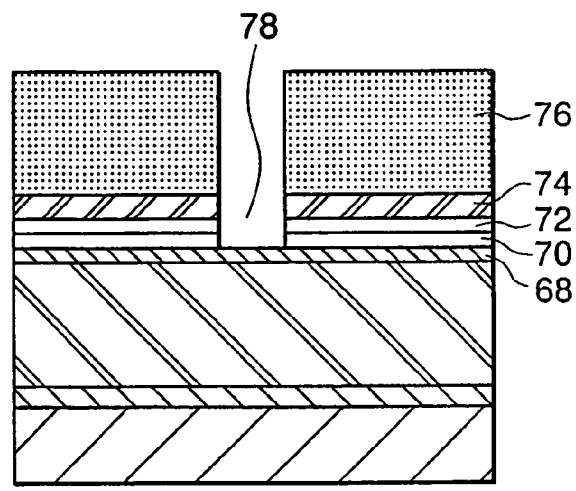

Thereafter, the etching mask 76 is used to etch the first ARC film 74, the P—SiN film 72 and the P—SiO$_2$ film 70 with a mixture of C$_4$F$_8$, CO, O$_2$ and Ar gases as the etching gas, whereby first openings 78 having the same diameter as the via plugs to be formed therein are formed on the P—SiC film 68 for exposing the P—SiC film 68, as shown in FIG. 5C.

Figure 5D:
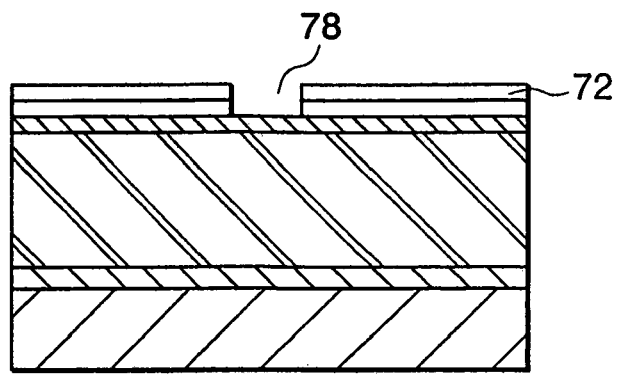

Now referring to FIG. 5D, the etching mask 76 and the first ARC film 74 are removed by an O$_2$ plasma ashing technique, thereby exposing the P—SiN film 72, as shown in FIG. 5D.

Figure 5E:
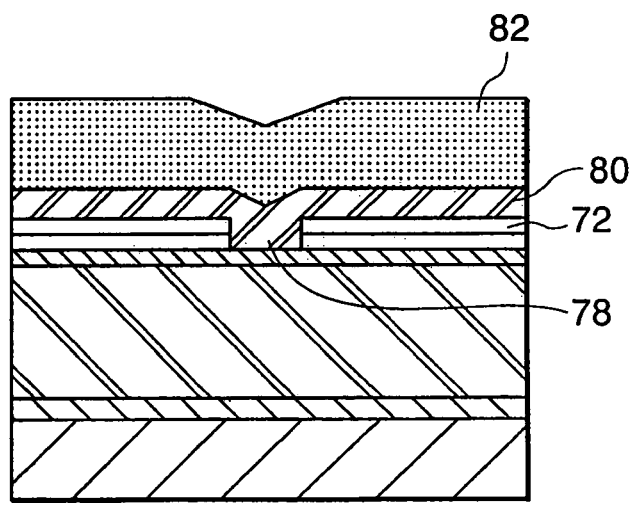

As shown in FIG. 5E, a second ARC film 80 having a film thickness of 100 nm is then deposited on the P—SiN film 72, while filling the openings 78, and further a photoresist film 82 having a film thickness of 400 nm is formed on the second ARC film 80.

Figure 5F:
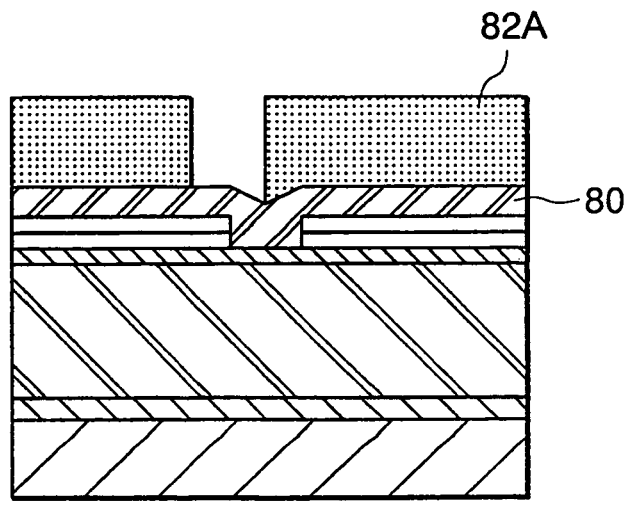

The photoresist film 82 is then patterned to form an etching mask 82A having an interconnection trench pattern for the upper-level interconnections, as shown in FIG. 5F. This figure shows the interconnection trench pattern misaligned with respect to the through-hole pattern to some extent so as to illustrate the advantageous effect off the inventive method.

Figure 5G:
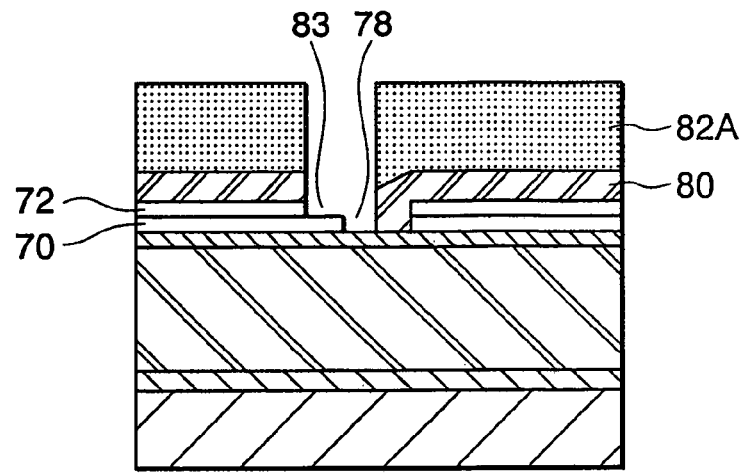

Thereafter, the second ARC film 80 and the P—SiN film 72 are etched as shown in FIG. 5G through the etching mask 82A and by a mixture of C$_4$F$_8$, CO, O$_2$ and Ar gases as the etching gas. As a result, second openings 83 communicating with the first openings 78 are formed on the P—SiO$_2$ film 70.

Figure 5H:
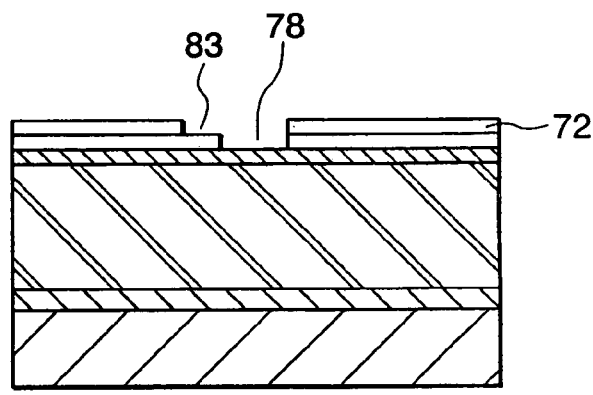

The etching mask 82A is then removed by an O$_2$ plasma ashing process, thereby exposing the P—SiN film 72, the second openings 83, and the first openings 78, as shown in FIG. 5H.

Figure 5I:
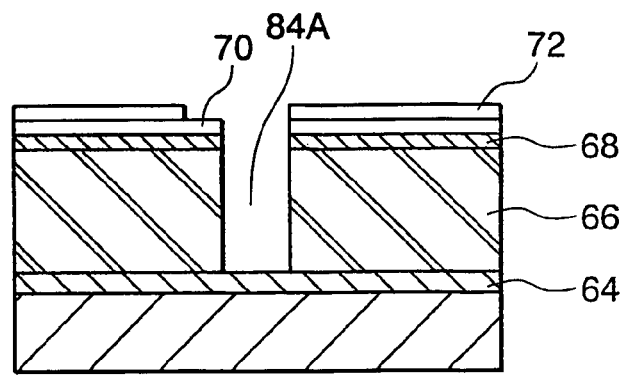

Next, referring to FIG. 5I, the P—SiO$_2$ film 70 is used as the etching mask to etch the P—SiC film 68 while using a mixture of C$_4$F$_8$, CO, O$_2$ and Ar gases as an etching gas, thereby exposing the low-K layer 66. Then, a mixture of N$_2$ and H$_2$ gases as the etching gas is used to etch the low-K layer 66, whereby third openings 84A are formed, which expose the P—SiC film 64 therethrough.

Figure 5J:
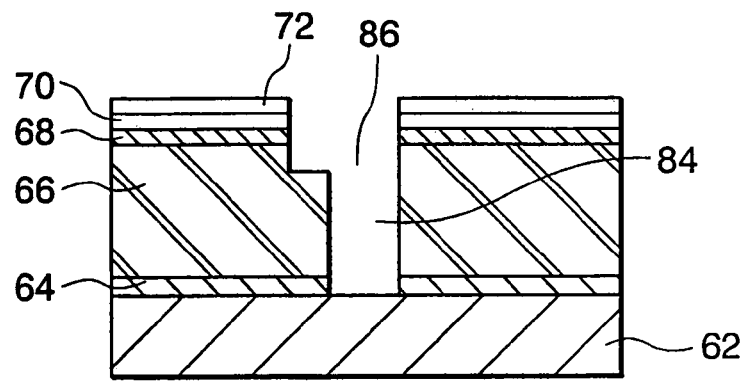

Referring to FIG. 5J, the P—SiN film 72 is used as the etching mask, and by using a mixture of C$_4$F$_8$, CO, O$_2$ and Ar gases, the P—SiO$_2$ film 70, the P—SiC film 68 and the low-K layer 66 are selectively etched to form interconnection trenches 86 for the upper-level interconnections. The etching is also effected to the P—SiC film 64 to thereby form through-holes 84 which expose the Cu layer 62 as the lower-level interconnections. Thereafter, a wet peeling is conducted.

Figure 5K:
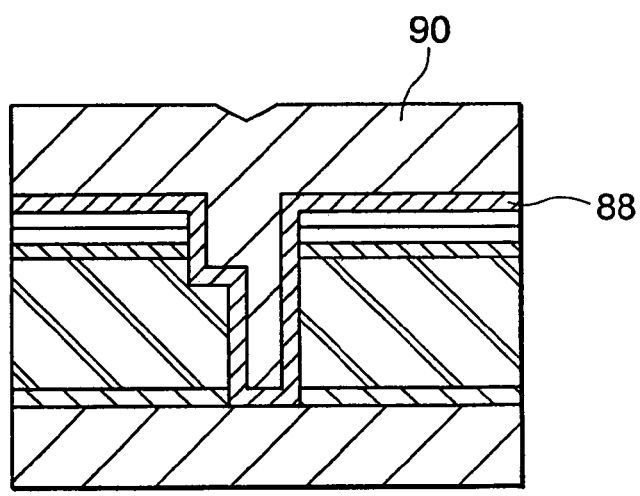
Figure 5L:
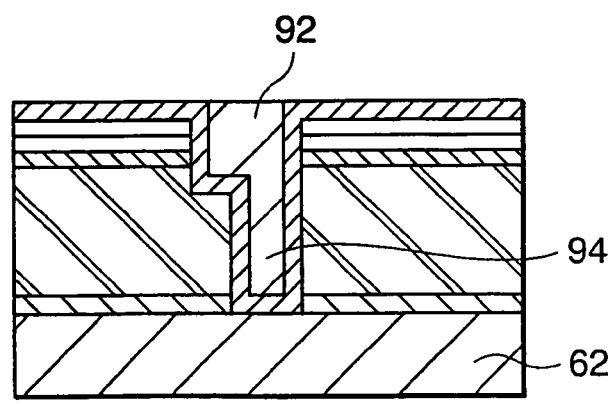

Next, as shown in FIG. 5K, a Ta layer 88 having a film thickness of 50 nm is formed as a barrier metal layer on the inner wall of the through-holes 84 and the interconnection trenches 86, as well as on top of the P—SiN film 72. Further, a Cu layer having a 100 nm film thickness is deposited by a Cu seed sputtering method, followed by deposition of another Cu layer having a film thickness of 800 nm by a plating method, whereby a total of 900-nm-thick Cu layer 90 is formed on the Ta film 88.

The Cu layer 90 and subsequently the Ta layer 88 are then polished and removed by a CMP method using a colloidal silica slurry as a polishing material, whereby the P—SiN film 72 is exposed. Thereafter, upper-level interconnections 92 and via plugs 94 for connecting the upper-level interconnections 92 to the lower-level interconnections 62 are formed.

Second Embodiment

A second embodiment, which is another example of the method of manufacturing a semiconductor device according to the invention, will be described by referring to FIGS. 6A to 6O, which are sectional views illustrating consecutive steps of the process for forming the interconnection structure according to the second embodiment.

In the present embodiment, an etch stop layer for the formation of the interconnection trenches is included in the low-K layer.

Figure 6A:
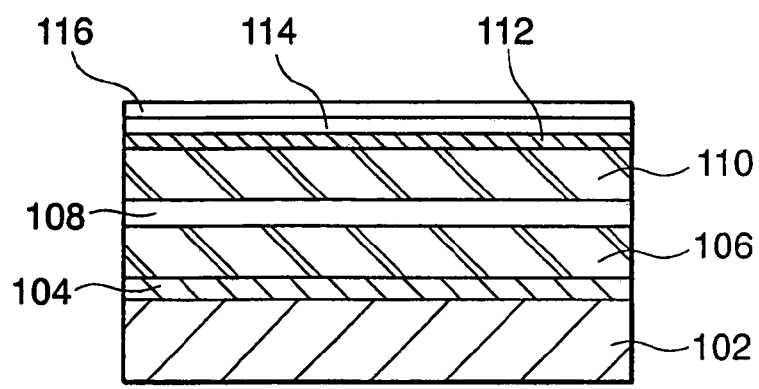
FIGS. 6A to 6O are sectional views of a semiconductor device, illustrating consecutive steps for the process of forming the interconnection structure according to a second embodiment of the present invention.

First, as shown in FIG. 6A, on a Cu layer 102 formed as a lower-level interconnections, there are formed consecutively a P—SiC film 104 having a film thickness of 50 nm, a first low-K layer 106 having a 300 nm film thickness as a first interlevel dielectric film, a P—SiO$_2$ film 108 having a 50 nm film thickness, and a low-K layer 110 having a film thickness of 300 nm as a second interlevel dielectric film by a plasma CVD method. Further, a P—SiC film 112, a P—SiO$_2$ film 114, and a P—SiN film 116, each having a 50 nm film thickness, are consecutively formed by a plasma CVD method, thereby forming a triple hard mask. In the present embodiment, the second low-K layer 108 is made of the material same as the material for the first low-K layer 106, so that it uses an organic polymer such as SiLK from Dow Chemical Co., for example. the P—SiO$_2$ film 108 functions as an etch stop layer during the formation of the interconnection trenches.

Figure 6B:
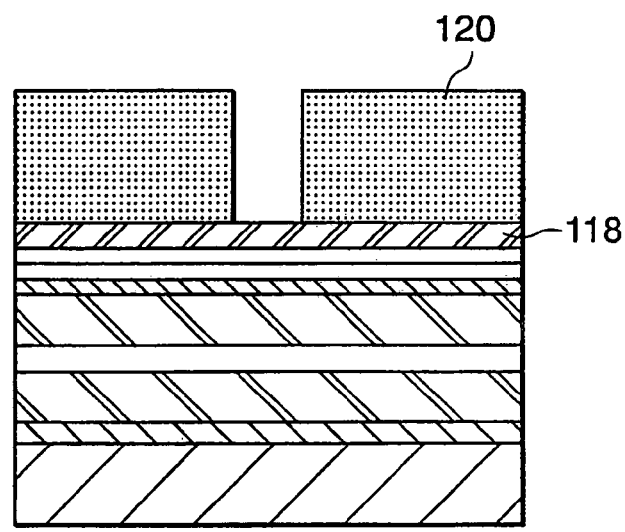

Next, as shown in FIG. 6B, a first ARC film 118 is formed on the P—SiN film 116, followed by coating the first ARC film 118 with a photoresist film having a 400 nm film thickness and etching the photoresist film to form an etching mask 120 having a through-hole pattern.

Figure 6C:
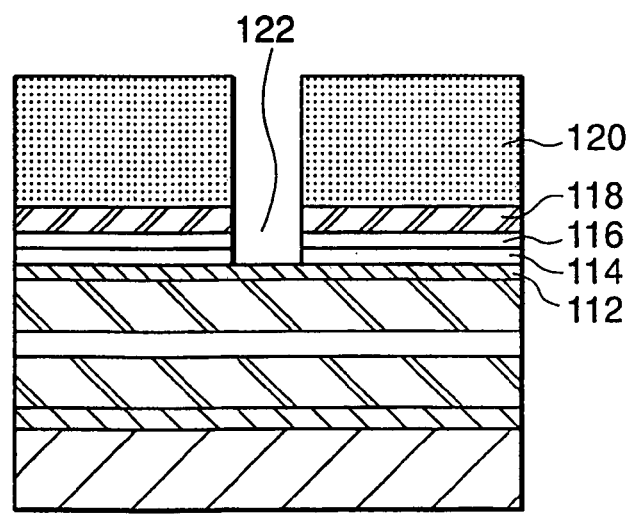

The etching mask 120 is used to etch the first ARC film 118, the P—SiN film 116 and the P—SiO$_2$ film 114 with the use of a mixture of $C_4F_8$, CO, O$_2$, and Ar gases as the etching gas, as shown in FIG. 6C, whereby first openings 122 with the same diameter as the through-holes are formed on the P—SiC film 112, exposing the P—SiC film 112 therethrough.

Figure 6D:
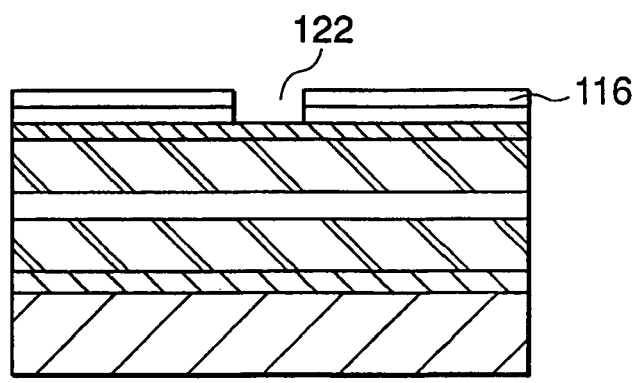

Then, an O$_2$ plasma ashing process is used to remove the etching mask 120 and the first ARC film 118, as shown in FIG. 6D, thereby exposing the P—SiN film 116.

Figure 6E:
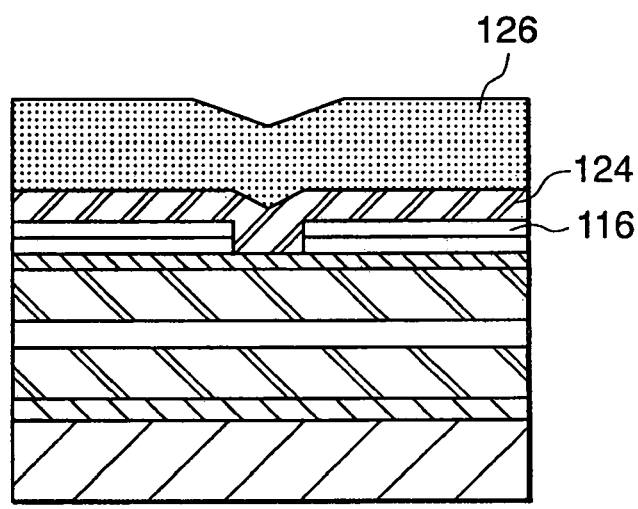

Thereafter, as shown in FIG. 6E, a second ARC film 124 having a film thickness of 100 nm is formed on the P—SiN film 116 while filling the openings 122, and further a photoresist film 126 having a film thickness of 400 nm is formed on the second ARC film 124.

Figure 6F:
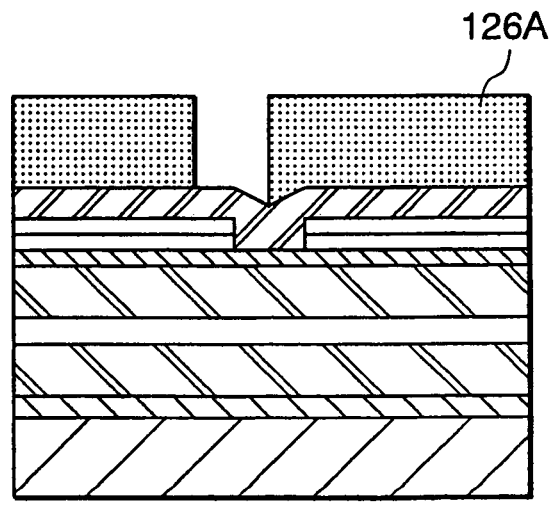

The photoresist film 126 is patterned to form an etching mask 126A having the interconnection trench pattern for the upper-level interconnections, as shown in FIG. 6F. This figure shows the interconnection trench pattern misaligned with respect to the through-hole pattern to some extent, to illustrate the advantageous effect of the present invention.

Figure 6G:
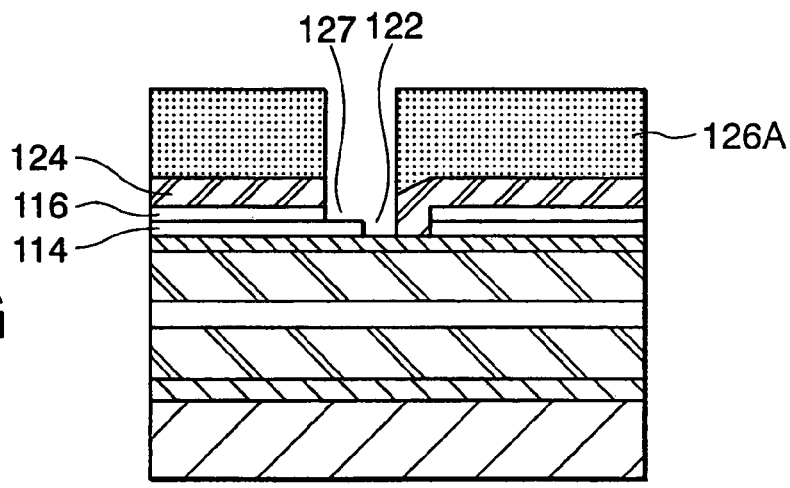

The etching mask 126A is used to etch the second ARC film 124 and the P—SiN film 116 while using a mixture of $C_4F_8$, CO, O$_2$ and Ar gases as the etching gas, as shown in FIG. 6G, whereby second openings 127 communicating with the first openings 122 are formed on the P—SiO$_2$ film 114.

Figure 6H:
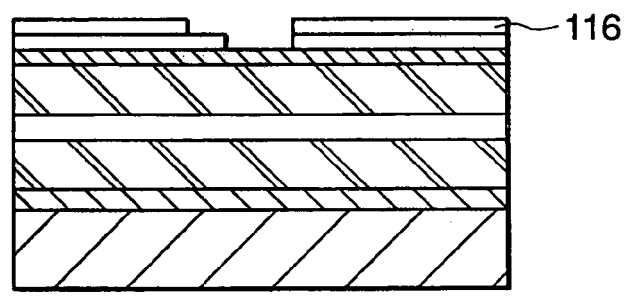

Then, the etching mask 126A is removed by an O$_2$ plasma ashing process, thereby exposing the P—SiN film 116, as shown in FIG. 6H.

Figure 6I:
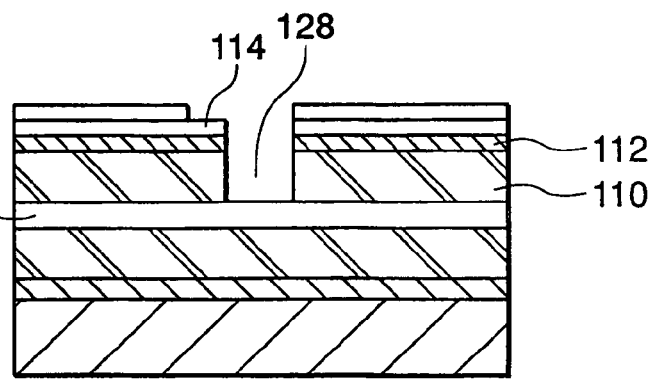

Thereafter, as shown in FIG. 6I, the P—SiC film 112 is etched by using the P—SiO$_2$ film 114 as an etching mask and a mixture of $C_4F_8$, CO, O$_2$ and Ar gases as an etching gas, thereby exposing the second low-K layer 110. Further, a mixture of N$_2$ and H$_2$ gases is used as an etching gas to selectively etch the second low-K layer 110, whereby holes 128 are formed which expose the P—SiO$_2$ film 108 therethrough.

Figure 6J:
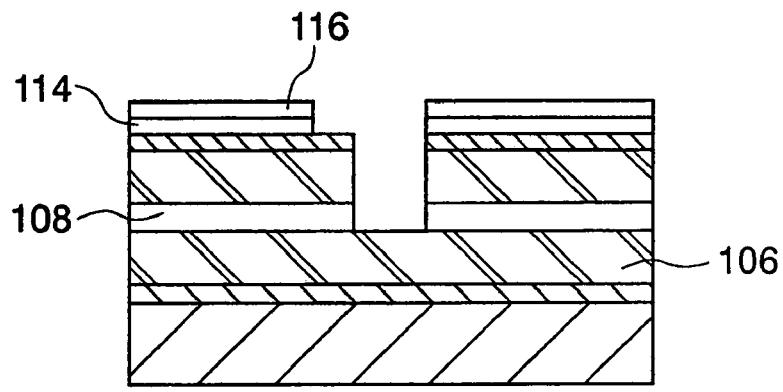

Now referring to FIG. 6J, the P—SiO$_2$ film 114 is selectively etched by using the P—SiN film 116 as an etching mask and a mixture of $C_4F_8$, CO, O$_2$ and Ar gases as the etching gas to expose the P—SiC film 112, while selectively etching the P—SiO$_2$ film 108 to expose the first low-K layer 106.

Figure 6K:
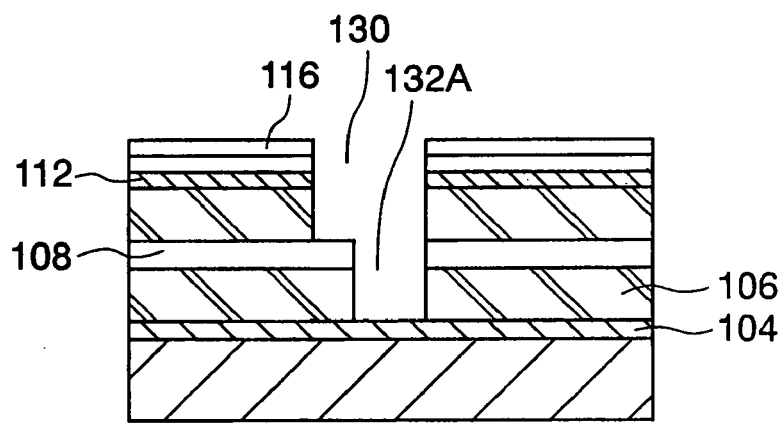
Figure 6L:
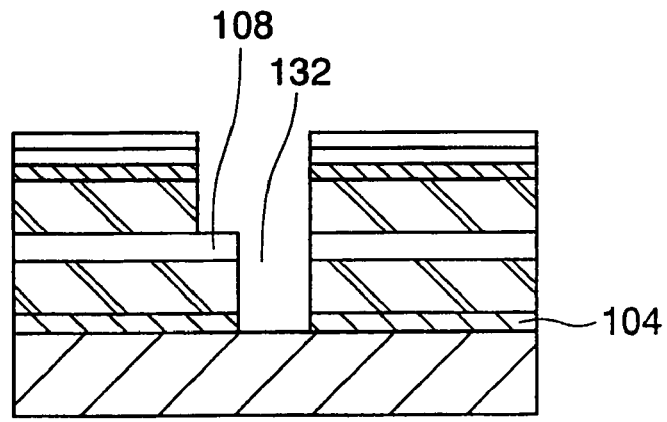

Next, as shown in FIG. 6K, the P—SiC film 112 and the second low-K layer 110 are selectively etched by using the P—SiN film 116 as an etching mask and a mixture of N$_2$ and H$_2$ gases as an etching gas, so that interconnection trenches 130 for the upper-level interconnection are formed. During this step, the P—SiO$_2$ film 108 functions as an etch stop layer. Simultaneously, the first low-K layer 106 is etched to form third openings 132A which expose the P—SiC film 104 therethrough.

Thereafter, the P—SiC film 104 is selectively etched by using the P—SiO$_2$ film 108 as an etching mask and a mixture of $C_4F_8$, CO, O$_2$ and Ar gases as an etching gas, as shown in FIG. 6I, whereby through-holes 132 are formed which expose the lower-level Cu layer 102 therethrough. This step is followed by a wet peeling.

Figure 6M:
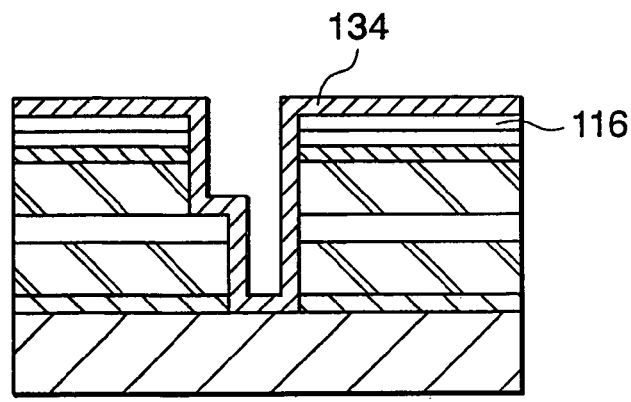

Then, as shown in FIG. 6M, a Ta layer 134 having a film thickness of 50 nm is formed on the inner walls of the through-holes 132 and the interconnection trenches 130 as well as on top of the P—SiN film 116, as a barrier metal layer.

Figure 6N:
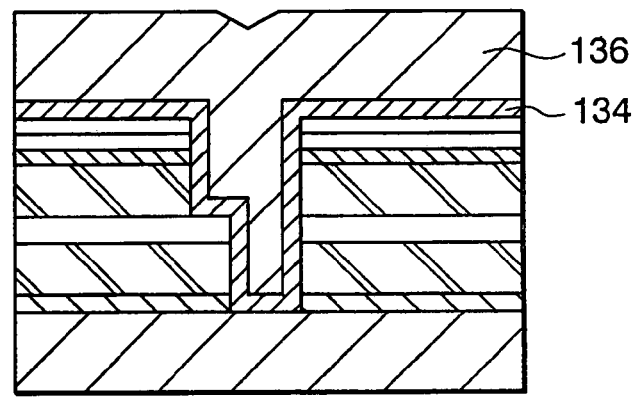

Further, as shown in FIG. 6N, a Cu layer having a 100 nm film thickness is deposited by a Cu seed sputtering method, and another Cu layer having an 800 nm film thickness is deposited by a plating method, thereby forming a Cu layer 136 having a total thickness of 900 nm on the Ta layer 134.

Figure 6O:
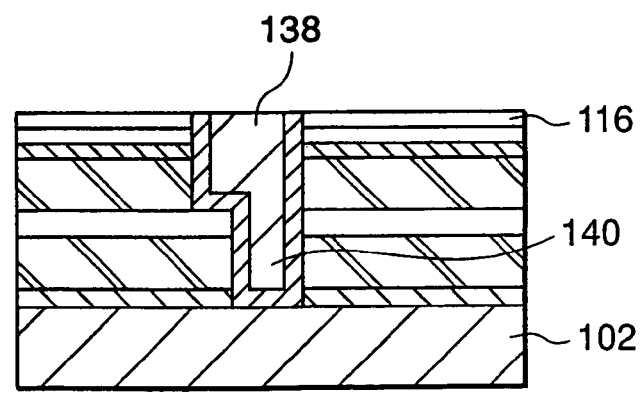

Thereafter, the Cu layer 136 and subsequently the Ta layer 134 are polished and, removed by a CMP method using colloidal silica slurry as the polishing material until the P—SiN film 116 is exposed as shown in FIG. 6O. Thus, upper-level interconnections 138 and via plugs 140 connecting the upper-level interconnections 138 and the lower-level interconnections 102 are formed.

Third Embodiment

Figure 7A:
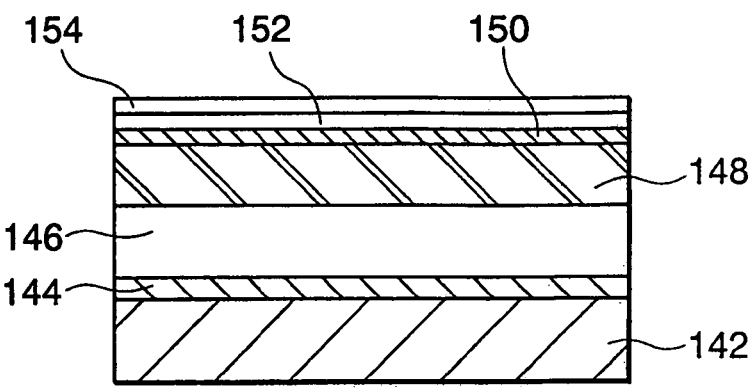
FIGS. 7A to 7N are sectional views of a semiconductor device, illustrating consecutive steps for the process of forming the interconnection structure according to a third embodiment of the present invention.

This embodiment is yet another example of the method of manufacturing semiconductor devices according to the present invention. FIGS. 7A to 7N are sectional views illustrating consecutive steps of the process for forming interconnections in accordance with the present embodiment.

In the present embodiment, an insulating film which serves as an etch stop layer for etching to form the interconnection trenches is formed under the low-K layer as a part of interlevel dielectric films.

As shown in FIG. 7A, on a Cu layer 142 formed as lower-level interconnections, there are consecutively formed by a plasma CVD method a P—SiC film 144 having a film thickness of 50 nm, a P—SiO$_2$ film 146 having a film thickness of 300 nm as a first interlevel dielectric film, and a low-K layer 148 having a film thickness of 300 nm as a second interlevel dielectric film. Then, a P—SiC film 150, a P—SiO$_2$ film 152, and a P—SiN film 154 are consecutively formed by a plasma CVD method, each having a film thickness of 50 nm, thereby forming a triple hard mask.

Figure 7B:
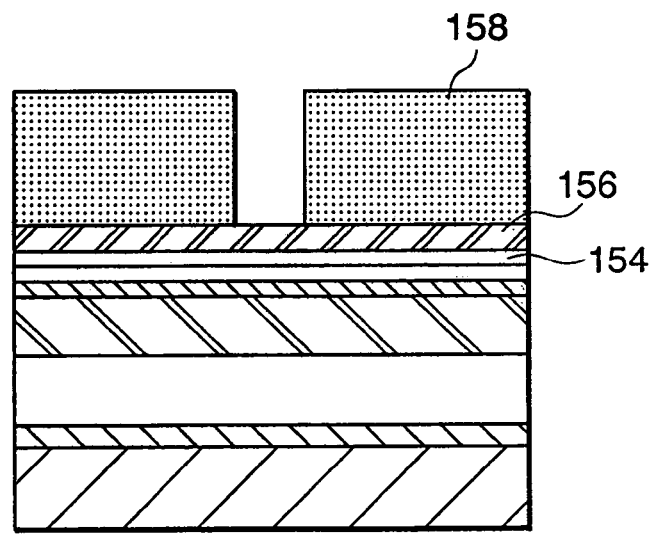

Next, as shown in FIG. 7B, a first ARC film 156 having a film thickness of 100 nm is formed on the P—SiN film 154, followed by formation of a photoresist film having a film thickness of 400 nm. Thereafter, the photoresist film is patterned to form an etching mask 158 having a through-hole pattern.

Figure 7C:
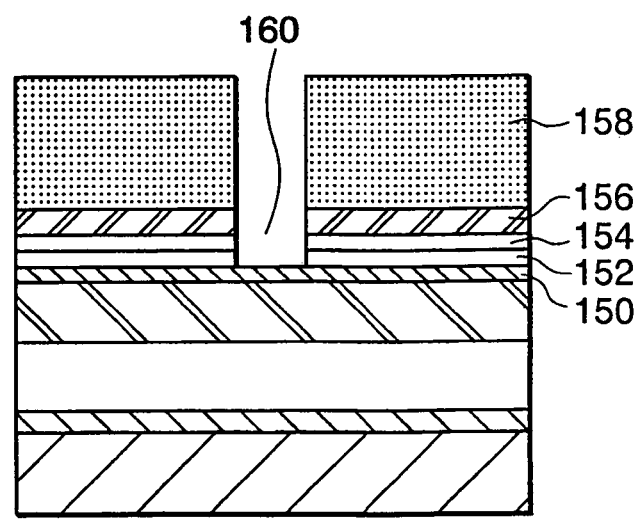

As shown in FIG. 7C, the first ARC film 156, the P—SiN film 154 and the P—SiO$_2$ film 152 are etched by using the etching mask 158 of a mixture of C$_4$F$_8$, CO, O$_2$ and Ar gases as an etching gas, whereby first openings 160 having the same diameter as the through-holes are formed on the P—SiC film 150, exposing the P—SiC film 150 therethrough.

Figure 7D:
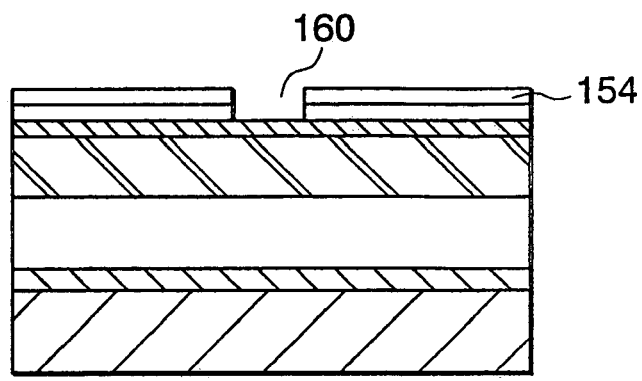

As shown in FIG. 7D, the etching mask 158 and the first ARC film 156 are then removed by an O$_2$ plasma ashing process, thereby exposing the P—SiN film 154.

Figure 7E:
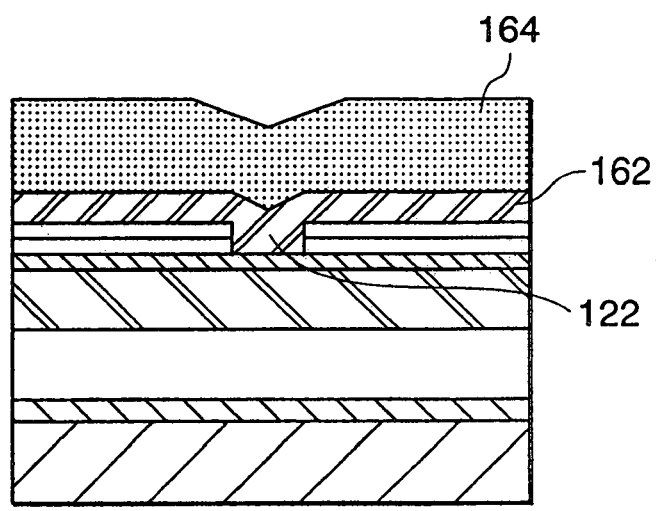

Then, as shown in FIG. 7E, a second ARC film 162 having a film thickness of 100 nm is formed on top of the P—SiN film 116 while filling openings 122, and further a photoresist film 164 having a film thickness 400 nm is formed thereon.

Figure 7F:
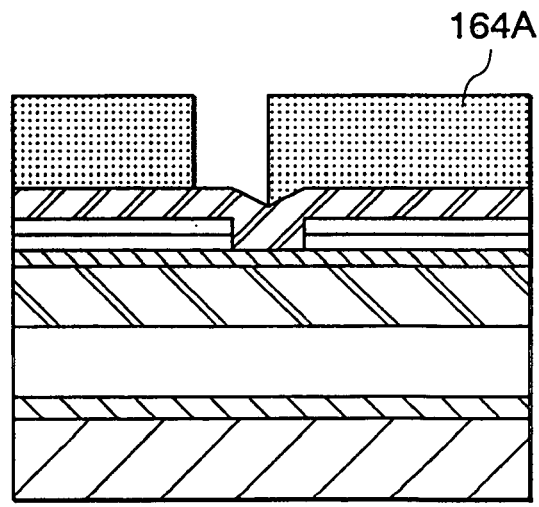

The photoresist film 164 is then patterned to form an etching mask 164A having an interconnection trench pattern for the upper-level interconnections, as shown in FIG. 7F. In this figure, the interconnection trench pattern is shown as misaligned with respect to the through-hole pattern to some extent, to illustrate the advantageous effect of the invention.

Figure 7G:
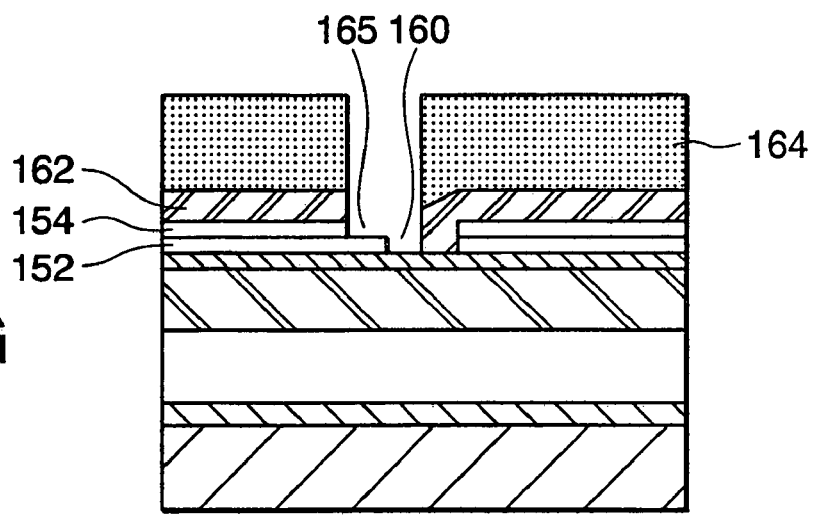

Thereafter, the second ARC film 162 and the P—SiN film 154 are selectively etched by using the etching mask 164A and a mixture of C$_4$F$_8$, CO, O$_2$ and Ar gases as the etching gas, whereby second openings 165 communicating with the first openings 160 are formed on the P—SiC film 152, as shown in FIG. 7G.

Figure 7H:
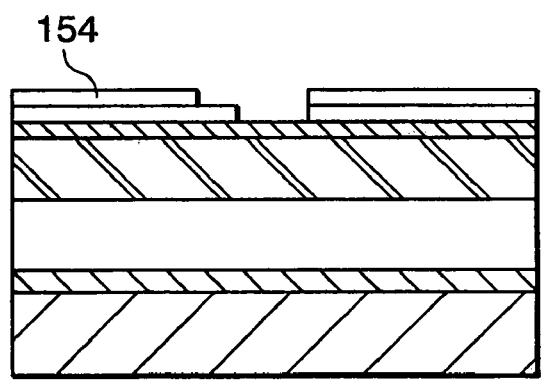

The etching mask 164A is then removed by an O$_2$ plasma ashing process as shown in FIG. 7H, thereby exposing the P—SiN film 154.

Figure 7I:
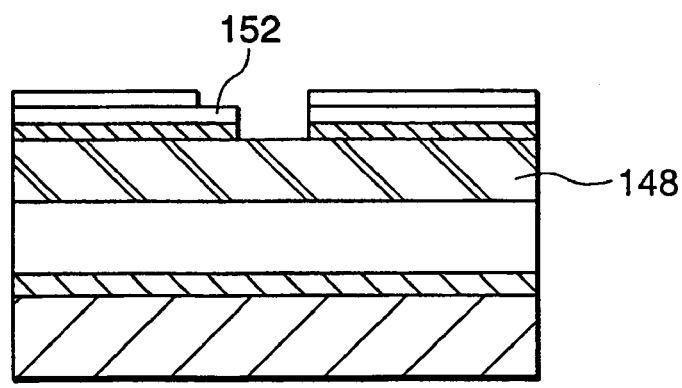

As shown in FIG. 7I, the P—SiC film 150 is selectively etched by using the P—SiO$_2$ film 152 as an etching mask and a mixture of C$_4$F$_8$, CO, O$_2$ and Ar gases as the etching gas, thereby exposing the low-K layer 148.

Figure 7J:
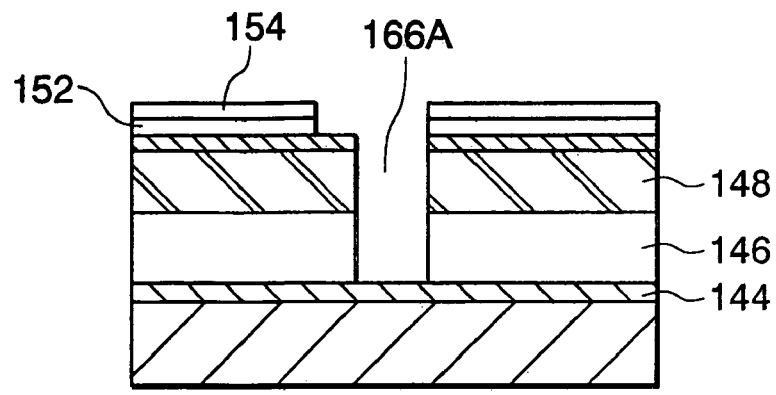

Then, as shown in FIG. 7J, the P—SiO$_2$ film 152, the low-K layer 148, and the P—SiO$_2$ film 146 are selectively etched by using the P—SiN film 154 as an etching mask and a mixture of N$_2$ and H$_2$ gases as an etching gas, thereby forming third openings 166A which expose the P—SiC film 144 therethrough.

Figure 7K:
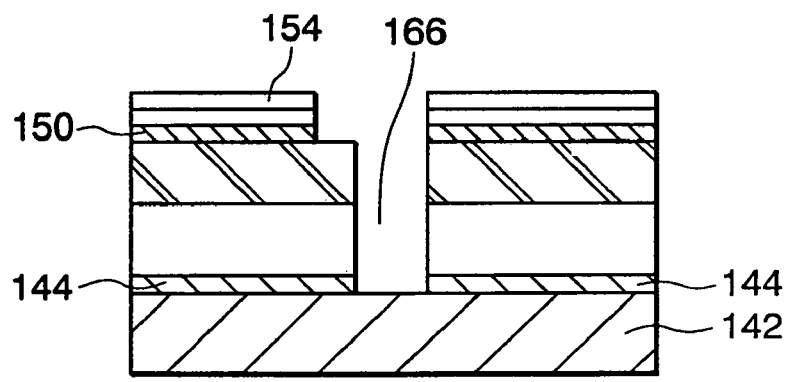

As shown in FIG. 7K, the P—SiN film 154 is then used as an etching mask to selectively etch the P—SiC film 150 and the P—SiC film 144 by using a mixture of C$_4$F$_8$, CO, O$_2$ and Ar gases as an etching gas, whereby through-holes 166 are formed exposing the Cu layer 142 therethrough.

Figure 7L:
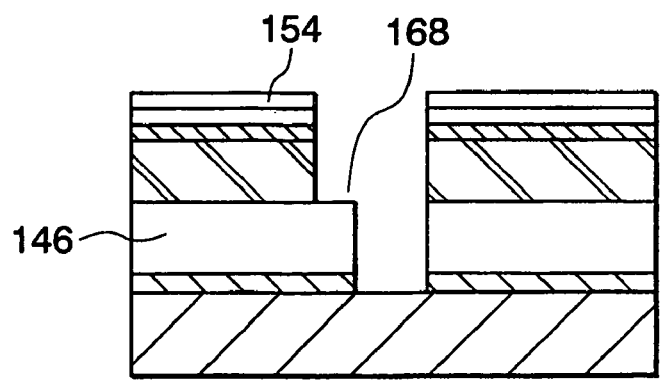

Next, as shown in FIG. 7L, the low-K layer 148 is etched by using the P—SiN film 546 as an etching mask and a mixture of N$_2$ and H$_2$ gases as an etching gas, thereby forming interconnection trenches 168 for the upper-level interconnections. During this etching, the P—SiO$_2$ film 146 functions as an etch stop layer. Subsequently, a wet peeling is effected.

Figure 7M:
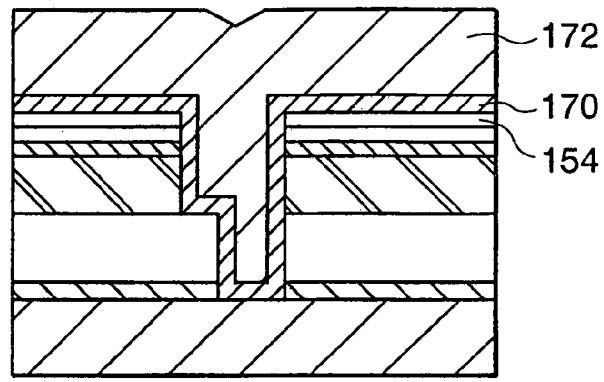
Figure 7N:
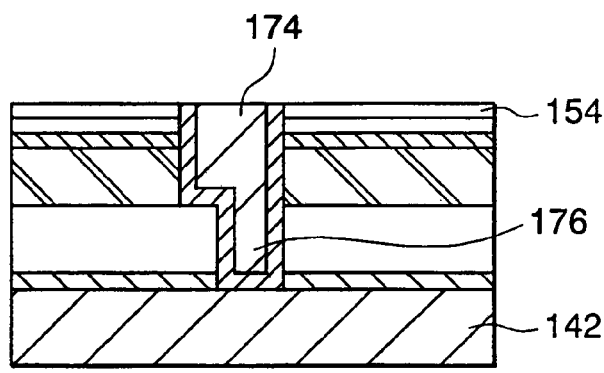

Further, as shown in FIG. 7M, a Ta layer 170 having a film thickness of 50 nm is formed as a barrier metal layer on the inner walls of the through-holes 166 and the interconnection trenches 168 and further on top of the P—SiN film 154. A Cu layer having a film thickness of 100 nm is then deposited by a Cu seed sputtering method, followed by the deposition of another Cu layer having a film thickness of 800 nm by a plating method. Thus, a total of 900-nm-thick Cu layer 172 is formed on the Ta layer 170.

Then, the Cu layer 172 and subsequently the Ta layer 170 are polished and removed by a CMP method using a colloidal silica slurry as a polishing material until the P—SiN film 154 is exposed as shown in FIG. 7N. Thus, upper-level interconnections 174 and via plugs 176 connecting the upper-level interconnections 174 to the lower-level interconnections 142 are formed.

In accordance with the present invention, there are consecutively formed, on a low-permittivity layer, a first insulating hard mask film, a second insulating hard mask film, and a third insulating hard mask film. Those insulating hard mask films constitute a triple hard mask film, each hard mask film having a different etching rate under the same etching conditions. The third hard mask film functions as the etching mask for the formation of the interconnection trench. The second hard mask film functions as an etching mask for the formation of the through-holes. The first hard mask film functions a low-permittivity layer protection film during the removal of the etching mask used in the formation of second openings after the second-opening formation step.

Accordingly, because of the presence of the first hard mask film on the low-permittivity layer during the removal of the etching mask used for the formation of the second openings following the second-opening formation step, the low-permittivity layer is not etched, even if there is a misalignment in the positioning of the etching mask.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
   a substrate;
   first level interconnections overlying said substrate;
   first and second dielectric films consecutively formed on said first level interconnections;
   third through fifth dielectric films having different compositions from one another, said third through fifth films respectively being arranged in a stack on one another thereby forming a triple hard mask; and
   interconnection trenches formed in said second through fifth dielectric films,
   wherein a part of a bottom surface and a part of a side surface of each of said interconnection trenches are defined by said second film,
   wherein said first through fifth dielectric films have through-holes penetrating therethrough, and
   wherein second level interconnections are formed in said interconnection trenches, and via plugs fill said through-holes to connect said first level interconnections to said second level interconnections.

2. The semiconductor device as defined in claim 1, wherein said first dielectric film is an anti-diffusion film for suppressing diffusion of said first level interconnections.

3. The semiconductor device as defined in claim 1, wherein said first level interconnections, said third dielectric film, said fourth dielectric film and said fifth dielectric film are made of Cu, SiC, SiO$_2$ and SiN, respectively.

4. The semiconductor device as defined in claim 1, wherein said third through fifth dielectric films and said upper portion in said second dielectric films are etched to form said interconnection trenches having upright etched ends to define trench-walls.

5. A semiconductor device comprising:
   a substrate;
   first level interconnections overlying said substrate;

first and second dielectric films consecutively formed on said first level interconnections; and third through sixth dielectric films having different compositions from one another, said fourth through sixth films respectively being arranged in a stack on one another thereby forming a triple hard mask, wherein said third through sixth dielectric films define interconnection trenches, wherein said first through sixth dielectric films have through-holes penetrating therethrough; and wherein second level interconnections are formed in said interconnection trenches, and via plugs fill said through-holes to connect said first level interconnections to said second level interconnections, wherein said third dielectric layer has a larger thickness than each one of said fourth through sixth dielectric films.

6. The semiconductor device as defined in claim 1, wherein the second dielectric film is a low-permittivity (low-K) layer.

7. The semiconductor device as defined in claim 5 wherein the third dielectric film is a low-permittivity (low-K) layer.

8. The semiconductor device according to claim 1, wherein a summation of thicknesses of said third through fifth dielectric film is smaller than a thickness of said second dielectric film.

9. A semiconductor device comprising:

a substrate;

first level interconnections overlying said substrate;

first and second dielectric films consecutively formed on said first level interconnections; and third through fifth dielectric films having different compositions from one another, said third through fifth films respectively being arranged in a stack on one another thereby forming a triple hard mask, wherein said third through fifth dielectric films and an upper portion in said second dielectric films define interconnection trenches, wherein said first through fifth dielectric films have through-holes penetrating therethrough, and wherein second level interconnections are formed in said interconnection trenches, and via plugs fill said through-holes to connect said first level interconnections to said second level interconnections, and wherein said third through fifth dielectric films collectively are thinner than said second dielectric film.

10. The semiconductor device according to claim 8, wherein a part of a bottom surface and a part of a side surface of each of said interconnect trench are defined by said second dielectric film.

* * * * *